US008404600B2

(12) United States Patent
Sandhu

(10) Patent No.: US 8,404,600 B2
(45) Date of Patent: Mar. 26, 2013

(54) METHOD FOR FORMING FINE PITCH STRUCTURES

(75) Inventor: Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1317 days.

(21) Appl. No.: 12/140,928

(22) Filed: Jun. 17, 2008

(65) Prior Publication Data

US 2009/0311867 A1 Dec. 17, 2009

(51) Int. Cl.
H01L 21/31 (2006.01)
C03C 15/00 (2006.01)

(52) U.S. Cl. .......... 438/763; 438/104; 438/19; 438/424; 438/435; 438/584; 438/587; 438/588; 438/589; 438/595; 438/758; 438/761; 216/2; 216/11; 216/37; 216/39; 216/40; 216/41; 216/46; 216/47; 216/54; 216/58; 216/83

(58) Field of Classification Search ................ 216/2, 11, 216/37, 39, 40, 41, 46, 54, 58, 83, 47, 4; 438/104, 109, 424, 435, 584, 587, 588, 589, 438/595, 758, 761, 763
See application file for complete search history.

(56) References Cited

U.S. PATENT DOCUMENTS

| 5,328,810 | A | 7/1994 | Lowrey et al. |
| 5,772,905 | A | 6/1998 | Chou |
| 6,319,853 | B1 | 11/2001 | Ishibashi et al. |
| 6,667,237 | B1 | 12/2003 | Metzler |
| 6,911,400 | B2 | 6/2005 | Colburn et al. |
| 6,926,953 | B2 | 8/2005 | Nealey et al. |

(Continued)

FOREIGN PATENT DOCUMENTS

| JP | 02-143527 | 6/1990 |
| JP | 03-003375 | 1/1991 |

(Continued)

OTHER PUBLICATIONS

Cerofolini et al., "Strategies for nanoelectronics", Microelectronic Engineering, 81 (2005), pg. 405-419.*

(Continued)

Primary Examiner — Shamim Ahmed
Assistant Examiner — Christopher Remavege
(74) Attorney, Agent, or Firm — Knobbe, Martens, Olson & Bear LLP

(57) ABSTRACT

A mold having an open interior volume is used to define patterns. The mold has a ceiling, floor and sidewalls that define the interior volume and inhibit deposition. One end of the mold is open and an opposite end has a sidewall that acts as a seed sidewall. A first material is deposited on the seed sidewall. A second material is deposited on the deposited first material. The deposition of the first and second materials is alternated, thereby forming alternating rows of the first and second materials in the interior volume. The mold and seed layer are subsequently selectively removed. In addition, one of the first or second materials is selectively removed, thereby forming a pattern including free-standing rows of the remaining material. The free-standing rows can be utilized as structures in a final product, e.g., an integrated circuit, or can be used as hard mask structures to pattern an underlying substrate. The mold and rows of material can be formed on multiple levels. The rows on different levels can crisscross one another. Selectively removing material from some of the rows can from openings to form, e.g., contact vias.

16 Claims, 12 Drawing Sheets

U.S. PATENT DOCUMENTS

| | | | |
|---|---|---|---|
| 7,115,525 | B2 | 10/2006 | Abatchev et al. |
| 7,141,866 | B1* | 11/2006 | Islam et al. ............ 257/628 |
| 7,208,379 | B2 | 4/2007 | Venugopal et al. |
| 7,268,065 | B2* | 9/2007 | Lin et al. ............ 438/510 |
| 2003/0170995 | A1 | 9/2003 | Chou |
| 2005/0112886 | A1 | 5/2005 | Asakawa et al. |
| 2005/0280118 | A1 | 12/2005 | Lin et al. |
| 2006/0216923 | A1 | 9/2006 | Tran et al. |
| 2006/0281266 | A1 | 12/2006 | Wells |
| 2007/0249170 | A1 | 10/2007 | Kewley |
| 2007/0281219 | A1 | 12/2007 | Sandhu |
| 2008/0057687 | A1 | 3/2008 | Hunt et al. |
| 2012/0138571 | A1* | 6/2012 | Black et al. ............ 216/41 |

FOREIGN PATENT DOCUMENTS

| | | |
|---|---|---|
| JP | 2003 155365 | 5/2003 |
| TW | 200601458 | 1/2005 |
| WO | WO 2006/101695 | 9/2006 |
| WO | WO 2007/027686 | 3/2007 |

OTHER PUBLICATIONS

Bates et al.; "Block Copolymers-Designer Soft Materials"; *Physics Today*; Feb. 1999, vol. 52, No. 2; pp. 32-38.

Black et al. "Nanometer-Scale Pattern Registration and Aignment by Directed Diblock Copolymer Self-Assembly," IEEE Transactions on Nanotechnology, vol. 3, No. 3 (Sep. 2004); pp. 412-415.

Black et al. "IBM demos new nanotechnology method to build chip components. Creates nanocrystal memory devices using self assembly technique compatible with conventional semiconductor processing," http://domino.research.ibm.com/comm/pr.nsf/pages/news.20031208_selfassembly.html; Dec. 8, 2003.

Callahan, Tim; "Pattern Formation"; Mathematics Department; www.math.lsa.umich.edu/~timcall/patterns/; Oct. 28, 2005; 5 pgs.

Carcia et al., "Thin films for Phase-shift Masks," *Vacuum and Thin Film*, IHS Publishing Group, 14-21 (Sep. 1999).

Chen et al., Achieving area-selective atomic layer deposition on patterned substrates by selective surface modification, Applied Physics Letters 86, 191910-1-191910-3 (2005).

Cheng et al. "Fabrication of nanostructures with long-range order using block copolymer lithography," Applied Physics Letters, vol. 81, No. 19, pp. 3657-3659 (Nov. 4, 2002).

Chou et al., Nanoimprint lithography, J.Vac. Sci. Technol. B 14(6), Nov./Dec. 1996, American Vacuum Society.

Cochran, Eric W.; Chemical Engineering—Iowa State University; www.iastate.edu/~ch_e/faculty/cochran.htm; Oct. 28, 2005; 2 pgs.

Edwards et al., "Precise Control over Molecular Dimensions of Block-Copolymer Domains Using the Interfacial Energy of Chemically Nanopatterned Substrates," *Advanced Materials*, 16, No. 15, (Aug. 4, 2004); pp. 1315-1319.

Fasolka et al.; "Block Copolymer Thin Films: Physics and Applications"; Annu. Rev. Mater. Res. 2001.31:323-355.

Guarini et al.; "Optimization of Diblock Copolymer Thin Film Self Assembly"; Adv. Mater. 2002, 14, No. 1, Sep. 16; pp. 1290-1294.

Guarini et al., "Low voltage, scalable nanocrystal FLASH memory fabricated by templated self-assembly," Electron Devices Meeting 2003, IEDM 03 Technical Digest. *IEEE* International Dec. 8-10, 2003, pp. 22.2.1-22.2.4.

Herr, Daniel J.C.; "The Extensibility of Optical Patterning Via Directed Self-Assembly of Nano-Engineered Imaging Materials"; Future Fab Intl.; www.future-fab.corn; 8 pgs.; Oct. 27, 2005.

Jeong et al.; "Asymmetric Block Copolymers with Homopolymers: Routes to Multiple Length Scale Nanostructures"; Adv. Mater. 2002, 14, No. 4, Feb. 19; pp. 274-276.

Jeong et al.; "Volume Contractions Induced by Crosslinking: A Novel Route to Nanoporous Polymer Films"; Adv. Mater. 2003, 15, No. 15, Aug. 5; pp. 1247-1250.

Kim et al., "Epitaxial self-assembly of block copolymers on lithographically defined nanopatterned substrates," *Nature* 424, 411-414 (Jul. 24, 2003).

Limary et al.; "Block Copolymer Thin Films Above and Below the Order-Disorder Transition Temperature"; Mat.Res.Soc.Symp. vol. 629; (2000) Materials Research Society; 6 pgs.

Nealy et al, "Directed assembly of imaging layers for sub-30 nm lithography", *First International Nanotechnology Conference on Communication and Cooperation*, Jun. 2005, 2 pages.

Ngandu, K., "Resolution Enhancement Techniques for Optical Lithography," NNIN REU Research Accomplishments, 90-91 (2004).

Park et al., Microcontact patterning of ruthenium gate electrodes by selective area atomic layer deposition, Applied Physics Letters 86, 051903 (2005).

Park et al., "Enabling Nanotechnology with Self-Assembled Block Copolymer Patterns," Polymer, Elsevier Science Publishers, B.V., GB, vol. 44, No. 22 pp. 6725-6760 (Oct. 2003).

Qin et al., On Wire Lithography, www.sciencemag.org, vol. 309, Jul. 1, 2005, p. 113-115.

Rockford et al., "Polymers on Nanoperiodic, Heterogeneous Surfaces," Physical Review Letters APS USA, vol. 82, No. 12 (Mar. 22, 1999).

Sinha et al., Area-Selective ALD of Titanium Dioxide Using Lithographically Defind Poly (methyl methacrylate) Films, Journal of the Electrochemical Society, 153 (5) G465-G469 (2006).

Stoykovich et al., "Directed Assembly of Block Copolymer Blends into Nonregular Device-Oriented Structures," *Science*, vol. 308, 1442-1446 (Jun. 3, 2005).

Tirrell et al.; "Self-Assembly in Materials Synthesis"; MRS Bulletin; vol. 30; Oct. 2005; pp. 700-704.

Wang et al., "Symmetric diblock copolymer thin films confined between homogenous and patterned surfaces: Simulations and theory," *Journal of Chemical Physics* vol. 112, No. 22 (2000); pp. 9996-10010.

Zheng et al.; "Structural Evolution and Alignment of Cylinder-Forming PS-*b*-PEP Thin Films in Confinement Studied by Time-Lapse Atomic Force Microscopy"; Mater.Res.Soc.Symp.Proc. vol. 854E (2005) Materials Research Society; 4 pgs.

http://mrsec.uchicago.edu/Nuggets/Stripes/; Oct. 27, 2005; 3 pgs.

"Molecular Thermodynamics & Statistical Mechanics (MTSM) Research Group"; www.engr.wisc.edu/groups/mtsm/research.shtml; Oct. 28, 2005; 7 pgs.

"Polymer Research Laboratory"; www.princeton.edu/~polymer/block.html; Oct. 27, 2005; 2 pgs.

International Search Report (International Application No. PCT/US2007/011524).

U.S. Office Action of Apr. 17, 2008 in U.S. Appl. No. 11/389,581, filed Mar. 23, 2006.

Sony CS-News vol. 29, 2002, Next Generation Low-Cost Electron Beam Lithography Fabrication Technology, wvvw.sony.net/Products/SC-HP/cx_news/vol29/pdf/mask.pdf.

International Search Report dated Jan. 12, 2010 in counterpart PCT Application No. PCT/US2009/045515.

Office Action dated Sep. 18, 2012 in corresponding PRC (China) Patent Application No. 200980122694.3.

* cited by examiner

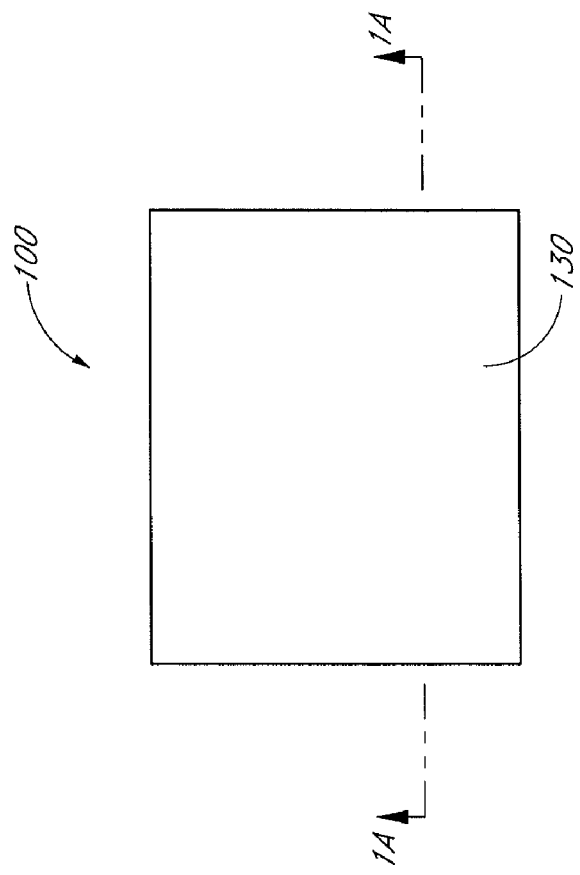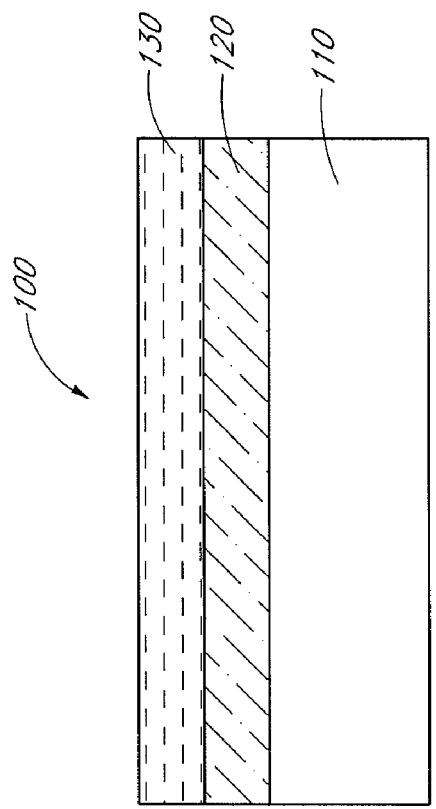
FIG. 1B
FIG. 1A

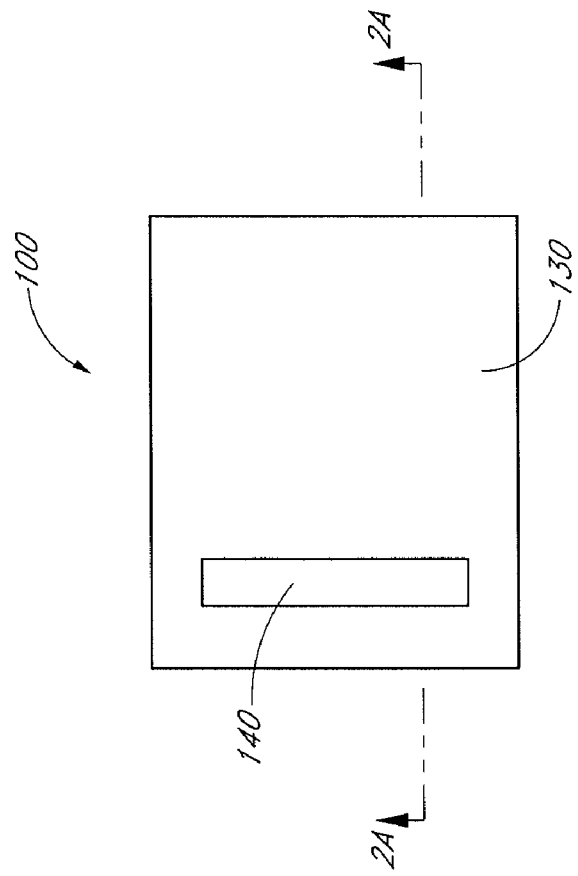
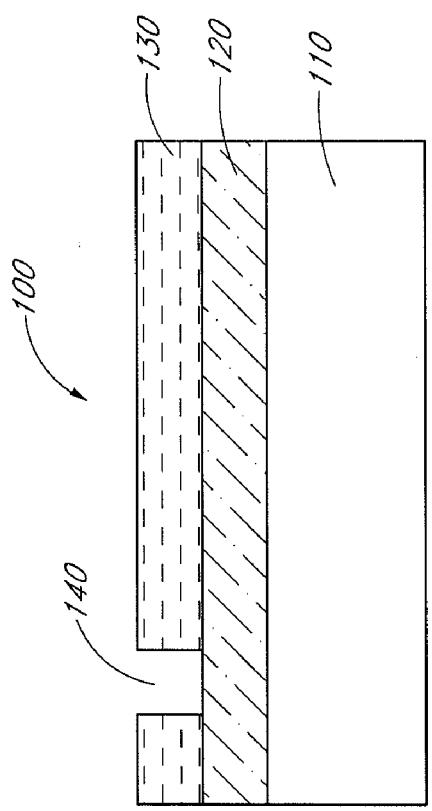
FIG. 2B
FIG. 2A

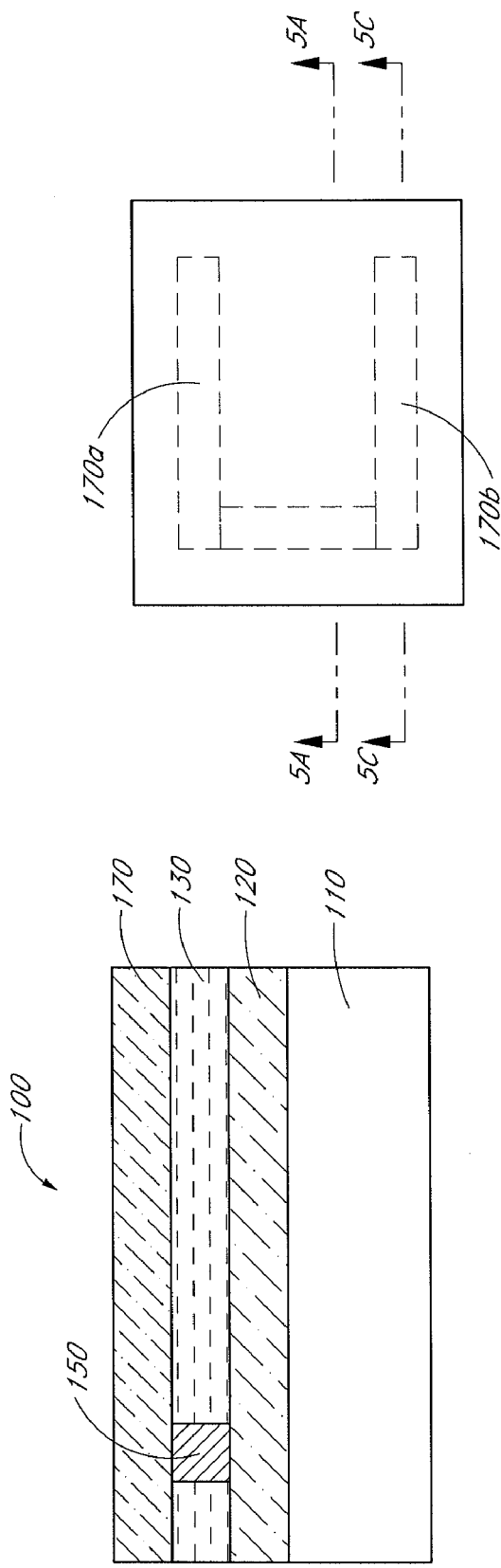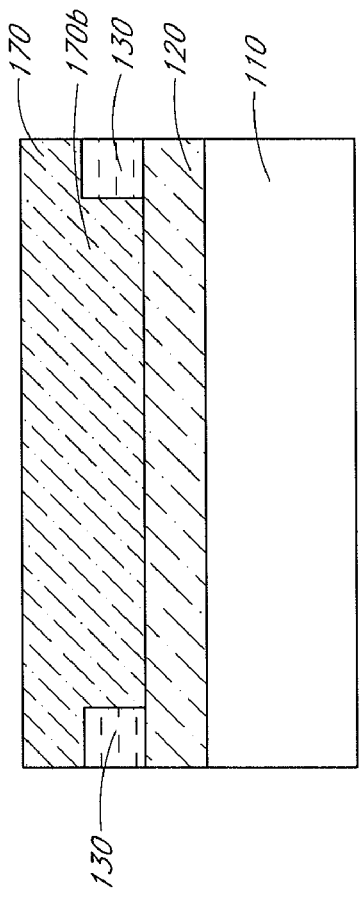
FIG. 5A
FIG. 5B
FIG. 5C

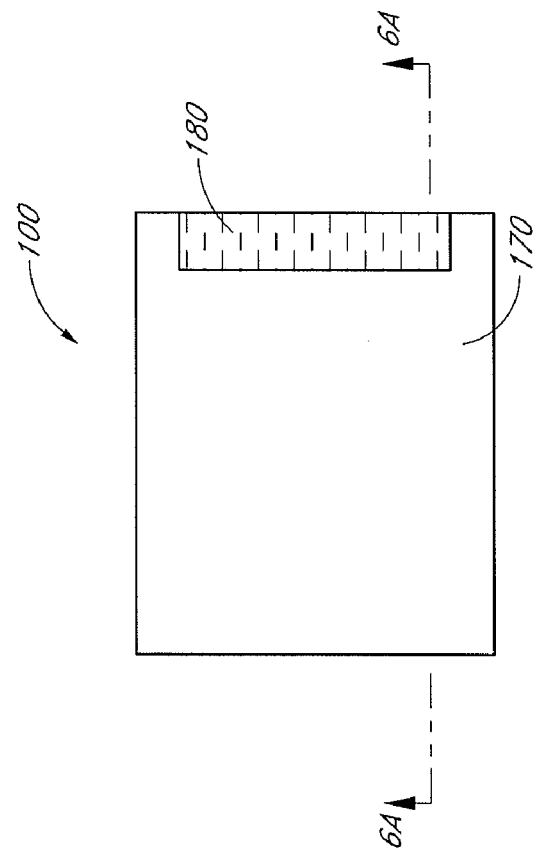
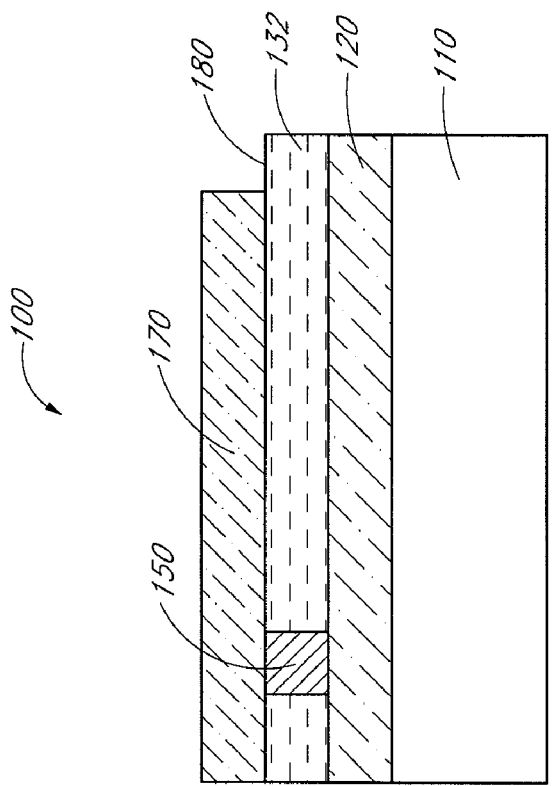
FIG. 6B
FIG. 6A

METHOD FOR FORMING FINE PITCH STRUCTURES

BACKGROUND OF THE INVENTION

1. Field of the Invention

This invention relates generally to techniques for fabricating closely spaced structures, such as, for example, features in an integrated circuit.

2. Description of the Related Art

Techniques for forming closely spaced structures have many applications. For example, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM for flash memory).

In another example, flash memory typically includes millions of flash memory cells containing floating gate field effect transistors that may retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. As a result, the ultimate resolution of lithography techniques is limited by factors such as optics and light or radiation wavelength.

In conjunction with radiation of a particular wavelength, photolithography utilizes photoresist compatible with that radiation. After being developed, the photoresist acts as a mask to transfer a pattern to an underlying material. The photoresist is sufficiently robust to withstand the development step without deforming and is also sufficiently robust to withstand an etch for transferring the mask pattern to an underlying material. As feature sizes decrease, however, the widths of the photoresist mask features also decrease, but typically without a corresponding decrease in the heights of these mask features. Due to the high aspect ratio of these mask features, it may be difficult to maintain the structural integrity of these thin mask features during the development and pattern transfer steps. Thus, the availability of sufficiently robust photoresist materials can limit the ability of photolithography to print features, as those features continue to decrease in size.

Accordingly, there is a continuing need for high resolution methods to pattern features.

BRIEF DESCRIPTION OF THE DRAWINGS

The invention will be better understood from the Detailed Description and from the appended drawings, which are meant to illustrate and not to limit the invention.

FIGS. 1A and 1B are schematic cross-sectional side and top plan views of a partially formed structure, in accordance with some embodiments of the invention.

FIGS. 2A and 2B are schematic cross-sectional side and top plan views of the partially formed structure of FIGS. 1A and 1B after forming an opening in a sacrificial layer, in accordance with some embodiments of the invention.

FIGS. 5A, 5B and 5C are schematic cross-sectional side and top plan views of the partially formed structure of FIGS. 4A and 4B after forming deposition inhibiting sidewalls and a deposition inhibiting cap layer, in accordance with some embodiments of the invention.

FIGS. 6A and 6B are schematic cross-sectional side and top plan views of the partially formed structure of FIGS. 5A and 5B after defining an opening exposing sacrificial material, in accordance with some embodiments of the invention.

DETAILED DESCRIPTION

Figure 3B:
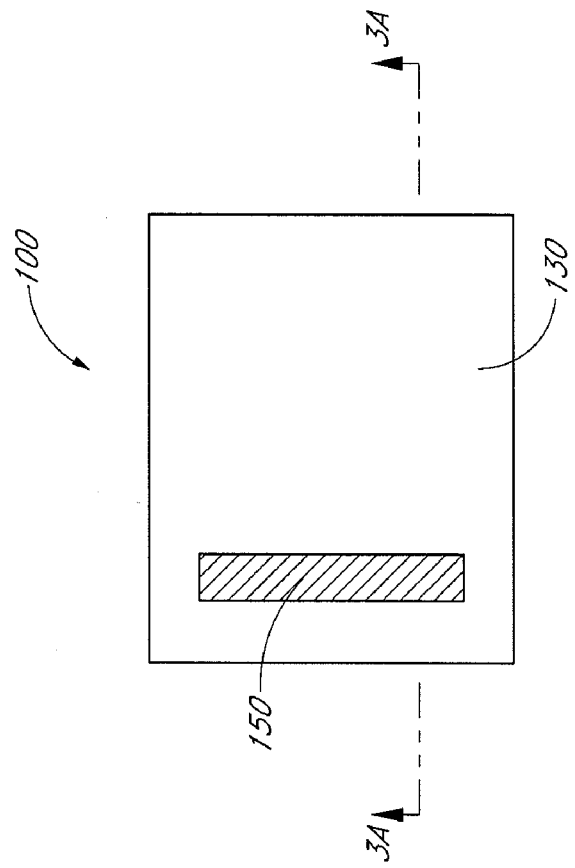
FIGS. 3A and 3B are schematic cross-sectional side and top plan views of the partially formed structure of FIGS. 2A and 2B after depositing a seed wall, in accordance with some embodiments of the invention.

Embodiments of the invention allow for the formation of exceptionally small features by selectively depositing material. A vertically extending surface, e.g., a sidewall, provides a template and a seed surface for the selective deposition of a first material. A second material is then selectively deposited on the first material. By alternating the deposition of two or more materials, alternating rows of the first and second materials, and optionally more materials, can be formed. One of the deposited materials is selectively removed. In embodiments where more than two materials are deposited, a plurality of materials can be removed. Advantageously, in some embodiments, the remaining rows of materials can form structures in a final product, thereby avoiding the costs and lower throughput associated with the multiple pattern formation and pattern transfer steps common to some integrated circuit fabrication processes. In some other embodiments, the free-standing rows can be used as hard masks for patterning an underlying substrate. In these applications, embodiments of the invention can avoid expensive and complicated lithography-based processes typically used to pattern small features.

It will be appreciated that deposition processes typically deposit material on all exposed surfaces. To selectively deposit on the seed surface, other exposed surfaces are formed of, or coated by, deposition inhibiting material. For example, in some embodiments, the seed surface is formed of a conductive material that facilitates electrochemical deposition on that surface, while other surfaces are formed of an insulating material that inhibits electrochemical deposition on those surfaces. As another example, in some other embodiments, the seed surface is formed of a material that allows chemical vapor deposition on that surface, while the other exposed surfaces include deposition inhibiting materials.

In some embodiments, the seed surface is provided in a mold having an opening. The ceiling, floor and sidewalls that define the interior volume of the mold having exposed deposition inhibiting surfaces. The seed surface forms an interior sidewall of the mold and the opening allows deposition precursors to enter the mold and deposit on the seed sidewall. The deposited material grows laterally, so that alternating rows of material also grow laterally within the mold. The height of the mold opening determines the height of the rows and the length of the rows is determined by the distance between opposing deposition inhibiting sidewalls at opposite ends of the rows. After the deposition of the rows of material, the mold can be selectively removed. In addition, desired rows of the deposited material can be removed to form free-standing, laterally-spaced rows formed of the remaining deposited material.

Advantageously, the deposition process controls the widths of the rows. In some embodiments, the deposition process can form rows that are thinner than rows that can be directly patterned by typical lithographic processes, such as 193 nm or 248 nm wavelength systems. Thus, sublithographic features can be formed. For example, features having a critical dimension in the range of about 1 nm to about 100 nm, or about 2 nm to about 50 nm, or about 3 nm to about 30 nm can be formed Reference will now be made to the Figures, wherein like numerals refer to like parts throughout. It will be appreciated that the Figures are not necessarily drawn to scale.

In a first phase of methods according to some embodiments, a mold having a seed wall is formed. With reference to FIGS. 1A and 1B, cross-sectional side and top plan views of a partially formed structure 100 are illustrated. It will be appreciated that the partially formed structure 100 is a partially formed integrated circuit in some embodiments.

With continued reference to FIGS. 1A and 1B, a substrate 110 is overlaid by a bottom deposition inhibiting layer 120, which is overlaid by a layer 130 of sacrificial material. The layers 120, 130 can be deposited by various deposition processes known in the art, the processes selected depending on the identity of the material to be deposited. Examples of deposition processes include vapor deposition processes, such as chemical vapor deposition (CVD), and spin on deposition processes.

The substrate 110 can be various objects over which a pattern will be formed. The substrate 110 can include a single material, a plurality of layers of different materials, a layer or layers having regions of different materials or different structures in them, etc. In some embodiments, these materials can include semiconductors, insulators, conductors, or combinations thereof. For example, the substrate can comprise doped polysilicon, a single crystal electrical device active area, a silicide, or a metal layer, such as a tungsten, aluminum or copper layer, or combinations thereof. In some embodiments, the substrate 110 includes a silicon wafer.

The bottom deposition inhibiting layer 120 can be deposited over the substrate 110 as a separate material, or can be formed by reaction of the substrate 110 to form a deposition inhibiting surface. The bottom deposition inhibiting layer 120 is chosen based upon the material to be deposited on the seed surface, the deposition process used to deposit the material and processing compatibility with other materials utilized with the partially formed structure 100.

The sacrificial material forming the sacrificial layer 130 is selectively removable relative to other exposed materials in the partially fabricated structure 100. An etch is "selective" to a material if the etch removes that material without removing a substantial amount of other material(s) exposed to the same etch. An example of a sacrificial material is, without limitation, molybdenum.

With reference to FIGS. 2A and 2B, the sacrificial layer 130 is etched to form a seed trench 140. The seed trench 140 is sized and shaped to accommodate a later-formed seed material, as discussed herein. It will be appreciated that the seed trench 140 can be formed by subjecting the sacrificial layer 130 to various pattern forming processes. For example, in some embodiments, a selectively definable layer (not shown) is provided over the layer 130. The selectively definable layer can be a photoresist layer. The photoresist layer is exposed to radiation through a reticle and then developed to leave a pattern including openings corresponding to the seed trench 140. The pattern in the photoresist layer is then transferred to the sacrificial layer 130 to form the seed trench 140.

Figure 3A:
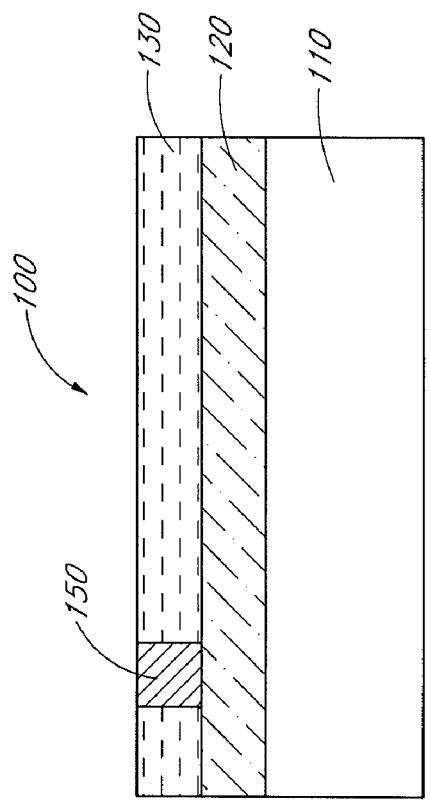

With reference to FIGS. 3A and 3B, a seed material is formed in the seed trench 140. The seed material can be deposited into the trench, e.g., by chemical vapor deposition, to form a seed wall 150.

Figure 4B:
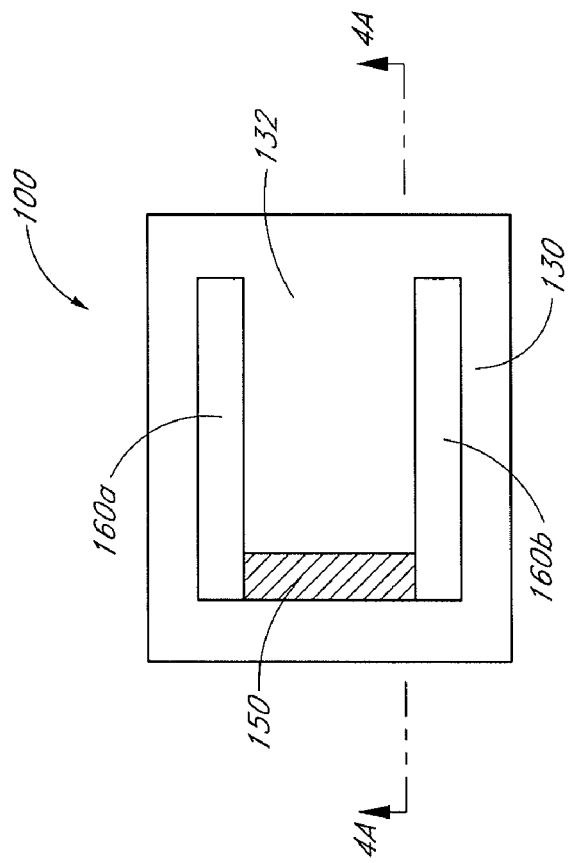
FIGS. 4A and 4B are schematic cross-sectional side and top plan views of the partially formed structure of FIGS. 3A and 3B after defining openings for deposition inhibiting sidewalls, in accordance with some embodiments of the invention.
Figure 4A:
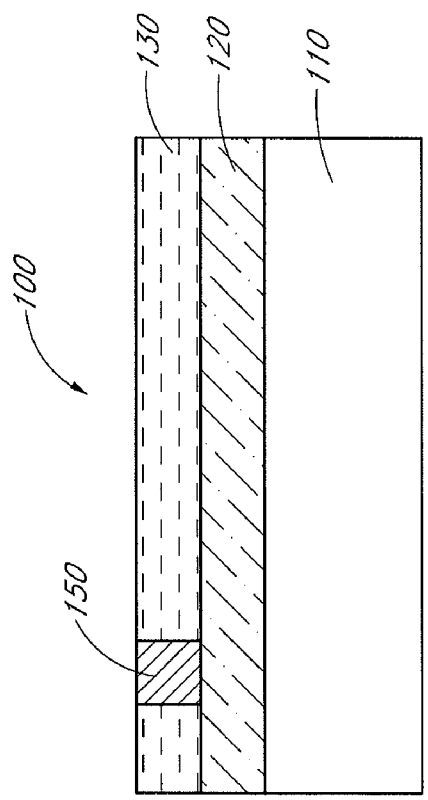

With reference to FIGS. 4A and 4B, sidewall trenches 160a, 160b are formed by various pattern forming processes known in the art. In some embodiments, a selectively definable layer (not shown), e.g., a photoresist layer, is provided over the layer 130. The photoresist layer is then exposed to radiation through a reticle and then developed to leave a pattern with openings corresponding to the sidewall trenches 160a, 160b. The pattern is transferred to the sacrificial layer 130 to form the sidewall trenches 160a, 160b.

The sidewall trenches 160a, 160b are subsequently filled with deposition inhibiting material to form deposition inhibiting sidewalls. The sidewall trenches 160a, 160b contact at least a portion of the seed wall 150 and partially partition off a mass or volume of sacrificial material 132 in the layer 130.

With reference to FIGS. 5A, 5B and 5C, a deposition-inhibiting cap layer 170 is formed over the sacrificial layer 130 and the seed wall 150. In the illustrated embodiment, the deposition inhibiting cap layer 170 is deposited directly on the sacrificial layer 130 and the seed wall 150. With reference to FIGS. 5B and 5C, the deposited deposition inhibiting material fills the trenches 160a, 160b (FIG. 4B) to form deposition inhibiting sidewalls 170a, 170b. It will be appreciated that FIG. 5B shows, in dotted lines, the locations of the sidewalls 170a, 170b underneath the layer 170a.

With reference to FIGS. 6A and 6B, the deposition inhibiting cap layer 170 is etched to define an opening 180 that exposes the sacrificial material 132. The location of the opening 180 is chosen to facilitate later removal of the sacrificial layer 130 and also to facilitate later selective deposition of materials beneath the layer 170.

The opening 180 can be formed by various patterning forming and etching methods known in the art. For example, in some embodiments, a photoresist layer (not shown) is deposited over the deposition inhibiting cap layer 170. The photoresist layer is then patterned to form openings corresponding to the sidewall openings 180. The pattern is then transferred to the deposition inhibiting cap layer 170 to form the openings 180. The transfer can be accomplished using an anisotropic etch.

Figure 8:
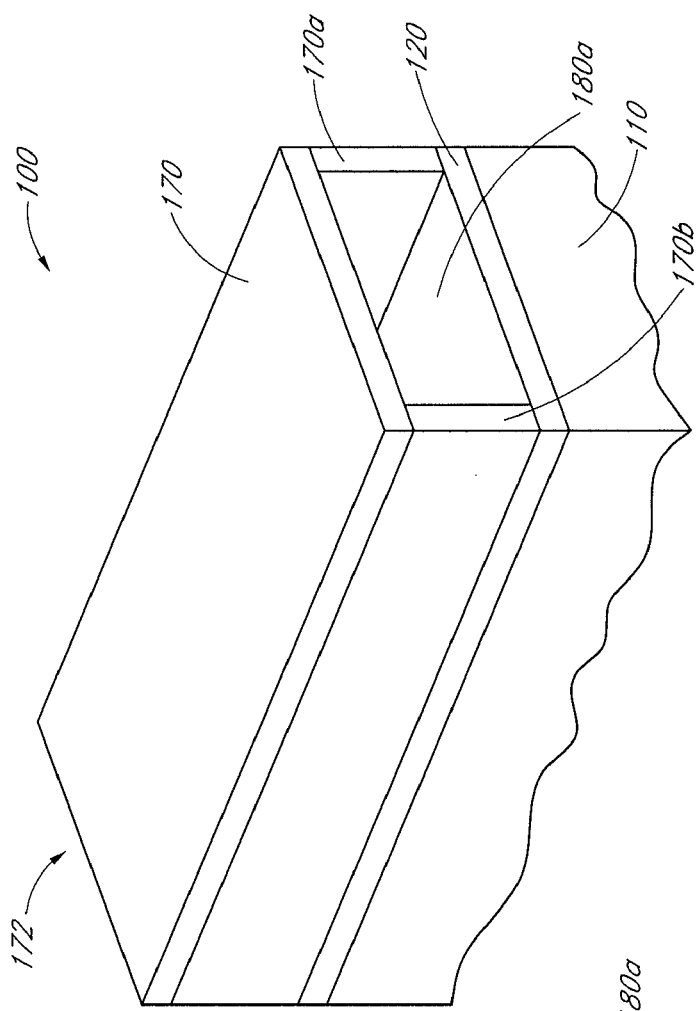
FIG. 8 is a schematic perspective view of the partially formed structure of FIG. 7, in accordance with some embodiments of the invention.
Figure 7:
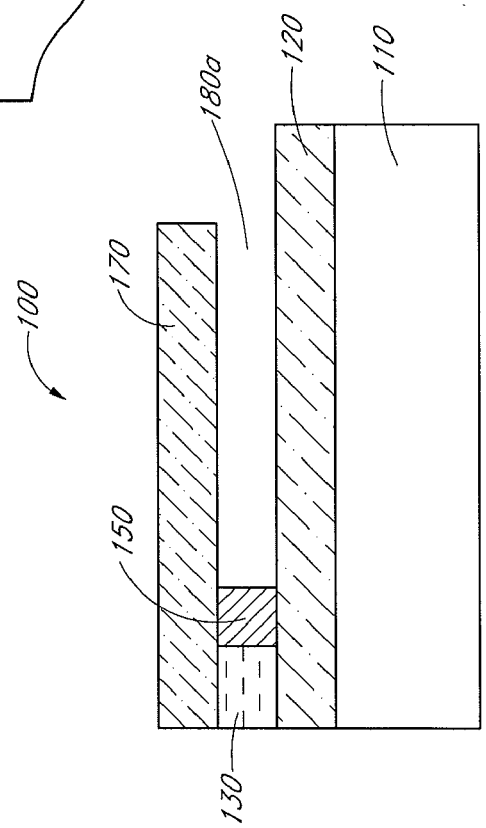
FIG. 7 is a schematic, cross-sectional side view of the partially formed structure of FIGS. 6A and 6B after removing sacrificial material to form a mold having an open volume, in accordance with some embodiments of the invention.

With reference to FIGS. 7 and 8, the sacrificial layer 130 is removed, leaving a cavity 180a. The cavity 180a is delimited by the deposition inhibiting layers 120, 170 (forming a floor and ceiling, respectively, of the cavity 180a) and the deposition inhibiting sidewalls 170a, 170b, which together form a mold 172, with the cavity 180a being an interior volume of the mold 172. The seed sidewall 150 is disposed at one end of the cavity 180a.

Figure 9A:
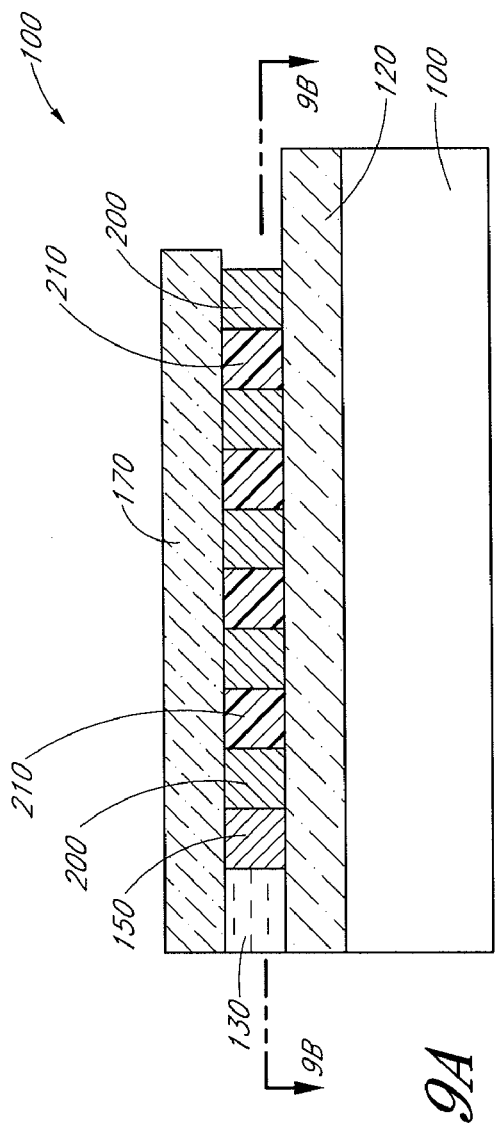
FIGS. 9A and 9B are schematic cross-sectional side and top plan views of the partially formed structure of FIGS. 7 and 8 after selectively depositing alternating rows of material in the mold, in accordance with some embodiments of the invention.
Figure 9B:
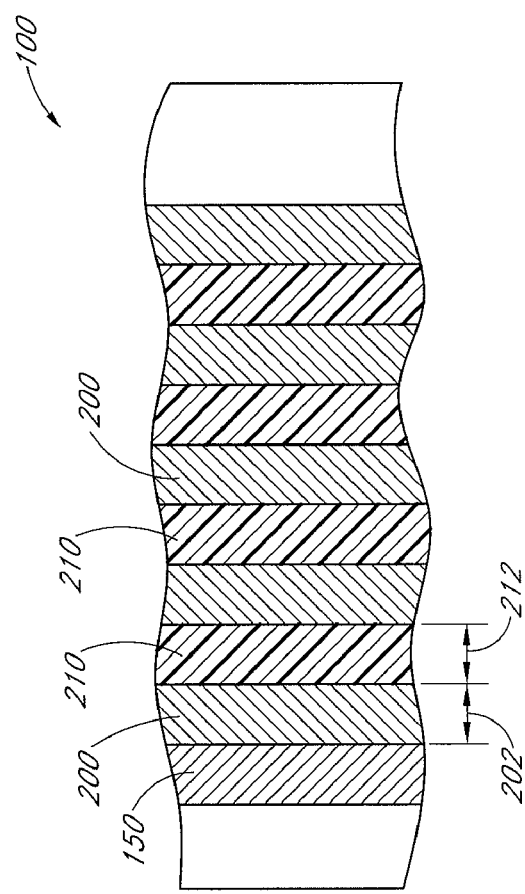

With reference to FIGS. 9A and 9B, a plurality of alternating mask materials are formed. In the illustrated embodiments, two materials are deposited. A first masking material is deposited on the seed wall 150. The first masking material is chosen to preferentially deposit on the seed wall 150 relative to the deposition inhibiting layers 120, 170 and also relative to the deposition inhibiting sidewalls 170a, 170b. The deposited first masking material forms a first row 200. The deposition continues until the row 200 reaches a desired width 202. The width 202 is approximately equal to the desired critical dimension of a feature formed using the row 200, or to an open volume having a desired width, in embodiments where the row 200 is removed.

The first row 200 roughly tracks the contours of the seed wall 150. While the seed wall 150 is illustrated extending lengthwise in a straight line for ease of illustration and description, in other embodiments, the seed wall 150 can curve or some portions of the wall 150 can extend at an angle relative to other portions. In some embodiments, the path of the wall 150 corresponds to the shape of the desired path of interconnects in an integrated circuit.

With continued reference to FIGS. 9A and 9B, a second material is deposited on an exposed side of the first row 200. The second material is chosen to preferentially deposit on the second row relative to the deposition inhibiting layers 120, 170 and also relative to the deposition inhibiting sidewalls 170a, 170b. The deposition of the second material continues to form a second row 210 having a desired width 212. The width 212 is equal to the desired critical dimension of a feature formed using the second rows 210 or, where the second rows 210 are to be removed, the width 212 is equal to a desired spacing between the first rows 200.

The deposition of the first and second materials continues in alternating fashion to form a plurality of alternating first rows 200 of the first material and second rows 210 of the second material. The alternating depositions are continued until a desired number of rows 200, 210 are formed. The deposition can be accomplished by, e.g., electrochemical deposition, chemical vapor deposition, or atomic layer deposition, depending on the materials forming the seed wall 150 and the first and second masking materials of the rows 200, 210, respectively. Preferably, the lateral distance between the opening 180 and the seed wall 150 (FIGS. 6A and 6B) is sufficiently large to extend over all desired rows 200, 210.

The first and second materials for the first and second rows 200, 210 are chosen to be selectively removable relative to each other. The materials forming the deposition inhibiting cap layer 170 and the sidewalls 170a, 170b are also chosen to be selectively removable relative to the row of the rows 200, 210 that is to be retained. In the illustrated embodiment, the row 200 is to be retained and other exposed materials are selectively removable relative to that row 200.

Figure 10A:
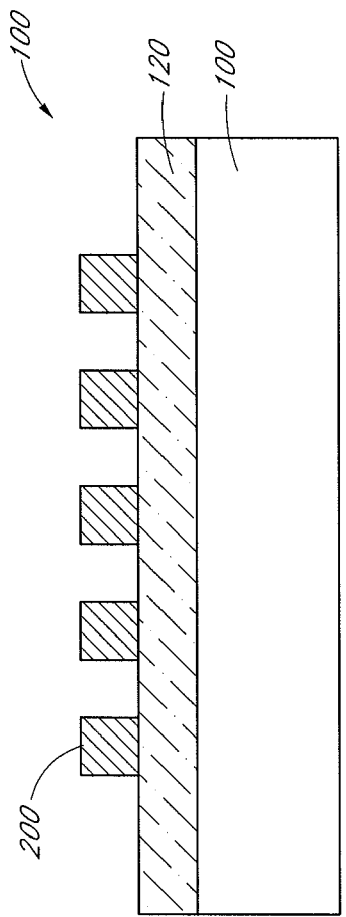
FIGS. 10A, 10B and 10C are schematic cross-sectional side and top plan views of the partially formed structure of FIGS. 9A and 9B after selectively removing depositing inhibiting sidewalls, the depositing inhibiting cap layer and one of the alternating rows of material, in accordance with some embodiments of the invention.
Figure 10B:
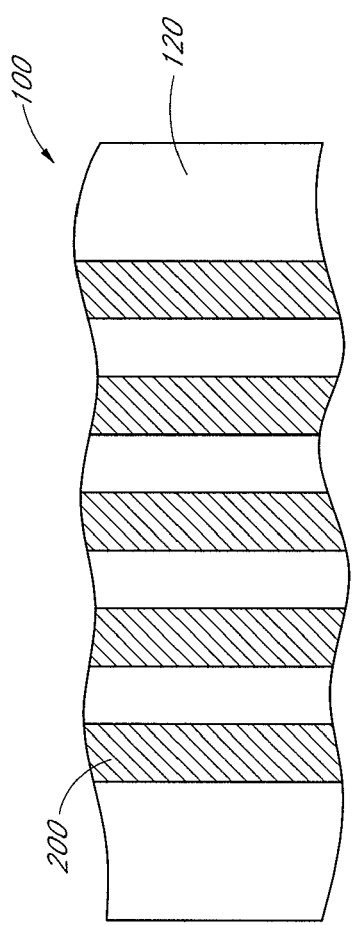

With reference to FIGS. 10A and 10B, the deposition inhibiting cap layer 170 and the sidewalls 170a, 170b are selectively removed. The removal can be accomplished using a wet or dry etch. Subsequently, the second rows 210 are removed. Separated, free-standing layers 200 are left remaining over the bottom deposition inhibiting layer 170.

Figure 10C:
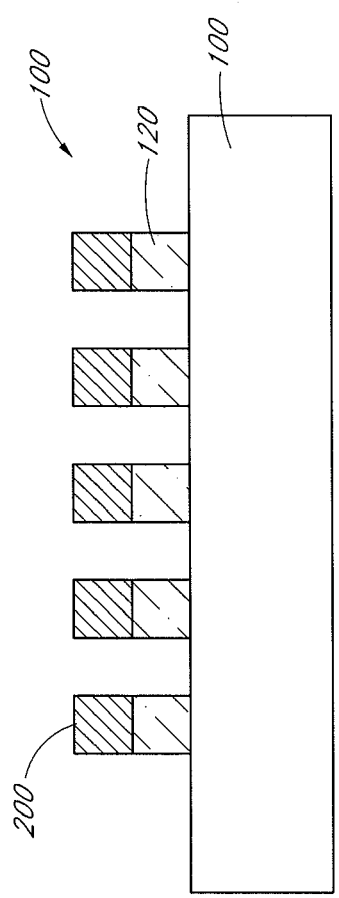

It will be appreciated that in some embodiments, the rows 200 can be used as mask features to allow a pattern transfer to an underlying material. For example, with reference to FIG. 10C, the rows 200 can be used to define a pattern in the bottom deposition inhibiting layer 120. The pattern transfer can be accomplished using an anisotropic etch selective for the bottom deposition inhibiting layer 120. In some embodiments, the pattern can be further transferred to the substrate 100. The pattern transfer can define various features in the partially formed structure 100, including, without limitation, interconnects for connecting electrical devices, preferably devices arranged in an array, such as the electrical devices which form a logic array or memory cells in the array region of a memory circuit. In some embodiments, substrate 100 includes a metal and the rows 200 directly define interconnects in the metal. In some other embodiments, the substrate 100 includes an insulator and the rows 200 define trenches that are later filled with metal to form interconnects.

In other embodiments, the rows 200 can be used as mandrels in a pitch multiplication process. Pitch multiplication is disclosed in U.S. Pat. No. 5,328,810 to Lowrey et al. and U.S. Pat. No. 7,253,118 to Tran et al. For example, a blanket layer of spacer material can be deposited on the rows 200. The blanket layer is anisotropically etched to define spacers on sidewalls of the rows 200. The rows 200 are selectively removed, thereby forming free-standing spacers. The free-standing spacers are used as masking features to define patterns in underlying materials. For example, the spacers can be used as mask features to etch an underlying substrate In some other embodiments, the rows 200 can form a part of a final structure. For example, where the rows 200 are formed of a conductor, the rows 200 can be used as interconnects. Where the rows 200 are formed of an insulator, metal can be deposited in the spaces between the rows 200 to form conductive interconnects.

Figure 11:
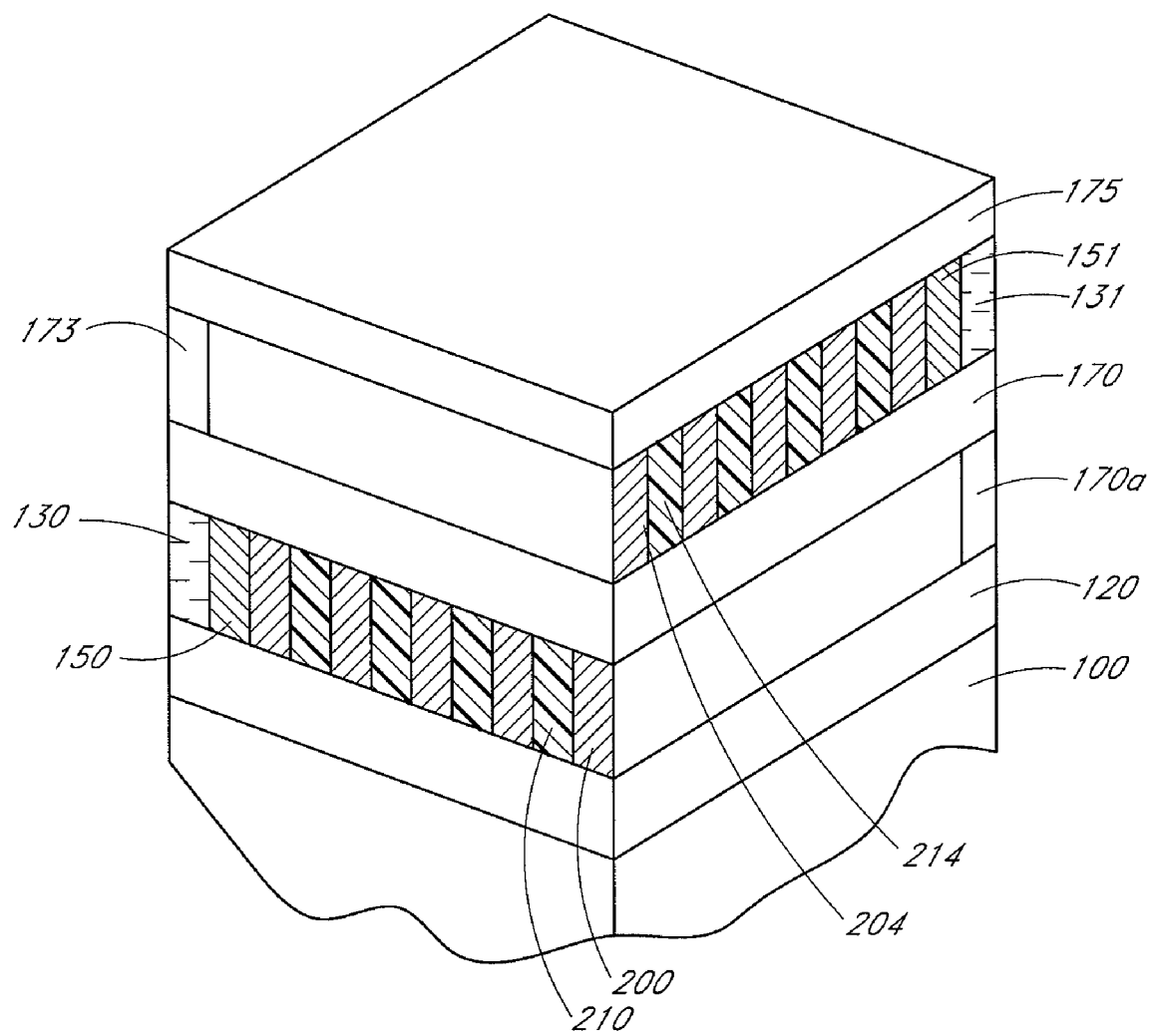
FIG. 11 is a schematic perspective view of the partially formed structure of FIGS. 9A and 9B after forming another mold overlying the selectively deposited alternating rows and depositing a second set of alternating rows of material in the other mold, in accordance with some embodiments of the invention.

With reference to FIG. 11, multiple levels of selectively deposited rows can be formed. An underlying level of rows including the rows 200, 210 is formed as discussed above with reference to FIGS. 1A-9A. The deposition inhibiting cap layer 170 is retained and a new mold is formed overlying the layer 170, in a similar manner as discussed above with reference to FIGS. 1A-8.

FIG. 11 shows a cross-sectional perspective view in which one of the depositing inhibiting sidewalls on each level is not shown, to allow illustrate of the orientation of rows on each level. As illustrated, the new mold includes a seed sidewall 131, a deposition-inhibiting sidewall 173, a depositing-inhibiting cap layer 175 and the deposition inhibiting layer 170. In some embodiments, the materials forming the seed sidewall 131, the deposition-inhibiting sidewall 173, and the depositing-inhibiting cap layer 175 can be the same as that forming the seed sidewall 130, the deposition-inhibiting sidewall 170a and the deposition inhibiting layer 170, respectively. The new mold is formed at a desired orientation relative to the underlying rows 200, 210. In some embodiments, the new mold is oriented to form alternating rows of different masking materials which crisscross the rows 200, 210.

With continued reference to FIG. 11, rows 204 formed of the first material are formed alternating with rows 214 formed of the second material.

Figure 12:
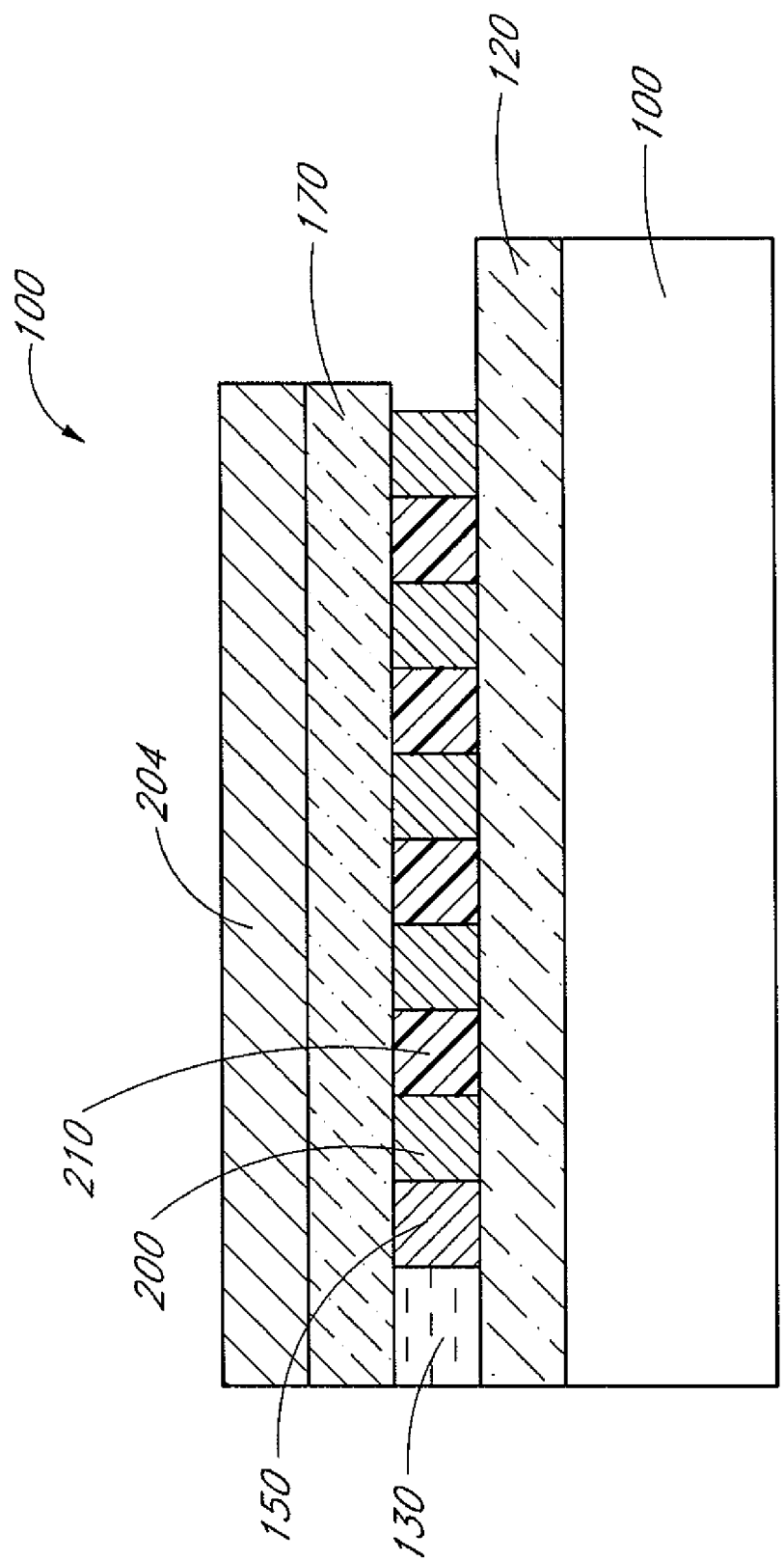
FIG. 12 is a schematic, cross-sectional side view of the partially formed structure of FIG. 11 after removing the sidewalls and cap layer of the other mold, in accordance with some embodiments of the invention.

With reference to FIG. 12, the rows 204 and 214 are exposed. The rows 204 and 214 are exposed by removing the sidewalls (including the illustrated sidewall 173 of FIG. 11) and the cap layer 175.

Figure 13A:
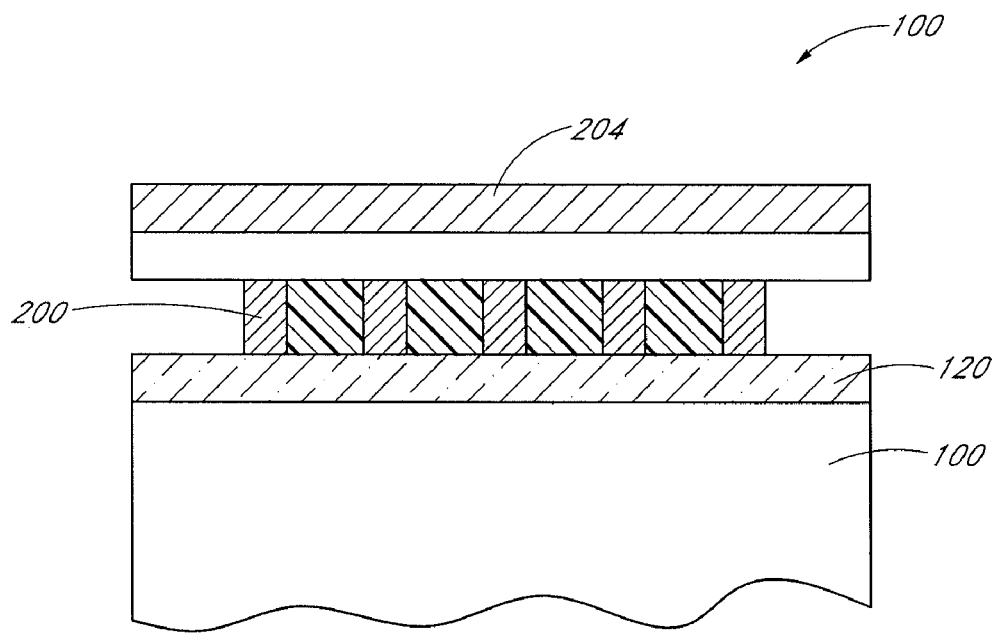
FIGS. 13A and 13B are schematic cross-sectional side and top plan views of the partially formed structure of FIG. 12 after selectively removing exposed parts of one of the rows in each of the sets of alternating rows, in accordance with some embodiments of the invention.
Figure 13B:
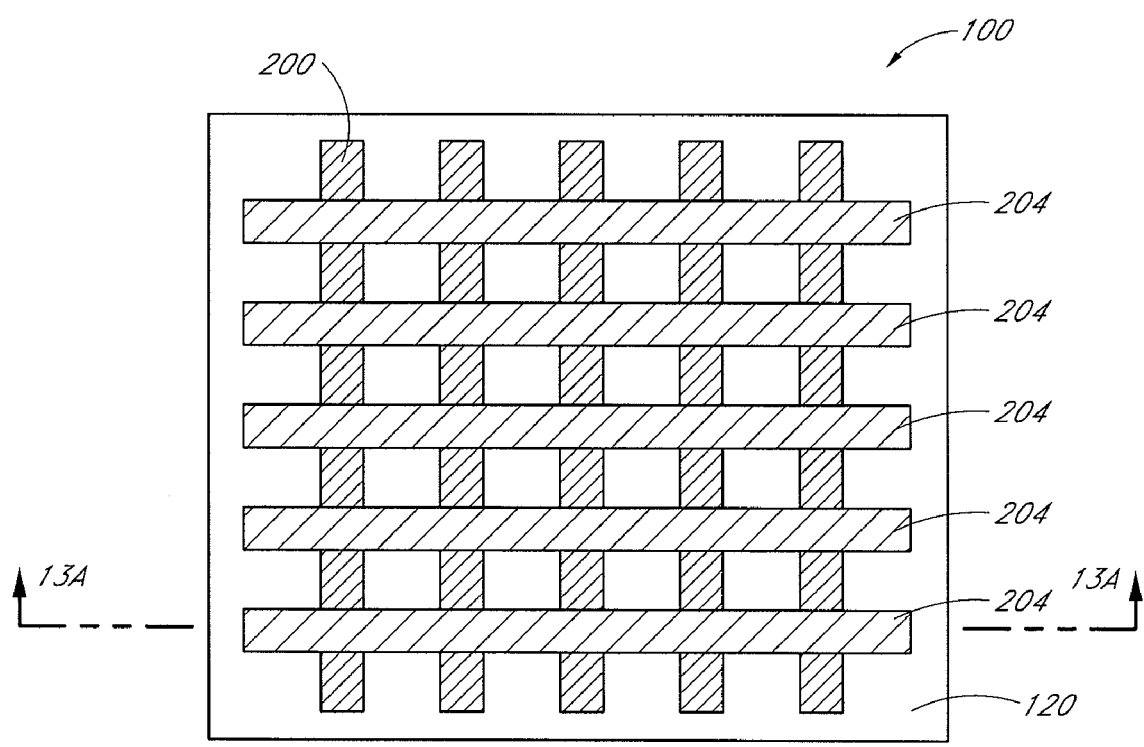

With reference to FIGS. 13A and 13B, exposed features formed of the second material are removed. A crisscrossing pattern of rows 200 and 204 is formed. The rows 200, 204 define open columns in the spaces between them. As noted herein, the crisscrossing pattern can be utilized as part of a final structure (e.g., crossing interconnects), or as a mask to form a pattern in underlying materials. The openings in the crisscrossing pattern can be filled to form isolated pillar shapes, including pillars having rectangular or cubic horizontal cross-sectional areas. Such an arrangement can be useful for forming, e.g., contact plugs. In addition, the pillars can advantageously be applied in some arrangements for patterning arrays of features, particularly dense arrays of features, such as capacitors for memory applications, including DRAM, or as memory elements for MRAM or STTRAM.

It will be appreciated that the various materials for the deposition inhibiting layers 120, 170, the deposition inhibiting sidewalls 170a, 170b, and the seed sidewall 150 are chosen based upon the materials that will be deposited in the cavity 180a (FIG. 7), and based upon, e.g., etch and deposition compatibility with the other materials forming the partially formed structure 100. For example, in some embodiments, the bottom deposition inhibiting layer 120 is formed of an insulator and the seed wall 150 is formed of a conductor. The first and second materials are deposited by electrochemical deposition. In some embodiments, gold and silver are used as the first and second materials. In another example, gold and nickel are used. Plating solutions including the desired metal species can be introduced into the opening 180. In some embodiments, the plating solution contains both materials.

The seed wall 150 can be connected to a power source and deposition occurs when current is flowed through the solution. In some embodiments, the seed wall 150 can be connected to a power source through the substrate 110. For example, the seed wall 150 can be made to extend through the deposition inhibiting layer 120 to contact the substrate 110, which may be formed of conductive or semiconductive material and which is connected to one of the electrodes of the power source. The width of each row can be controlled by selection of the charge passed during the deposition and by selection of the concentrations of the metal species. For example, to increase the width of a row formed by one of the metals, the concentration of that metal can be increased. Suitable selective deposition methods are discussed in Qin et al., Science, Vol. 309, Jul. 1, 2005, pp. 113-115.

Once deposited and after the rows 200, 210 are exposed, one of the metals can be removed by an appropriate etch. For example, Ni can be selectively removed relative to gold using a wet etch, such as a wet etch including concentrated $HNO_3$. In another example, where gold and silver are used the first and second materials, silver rows can be selectively removed using a wet etch formed of methanol, 30% ammonium hydroxide and 30% hydrogen peroxide (4:1:1 v/v/v). Suitable etch methods are discussed in Qin et al., Science, Vol. 309, Jul. 1, 2005, pp. 113-115.

In another example, materials are selectively deposited in the cavity 180a by atomic layer deposition (ALD). In some embodiments, the seed sidewall 150 is formed of silicon, and the deposition inhibiting layers 120, 170, and the deposition inhibiting sidewalls 170a, 170b are formed of silicon oxide having a chemically modified surface. The deposition inhibiting layers 120, 170, and the deposition inhibiting sidewalls 170a, 170b are formed as described above, and then exposed to another chemical species to form a deposition inhibiting layer on exposed silicon oxide surfaces. For example, octadecyltrichlorosilane (ODTS) can be provided to the cavity 180a, where it is selectively adsorbed on silicon oxide surfaces relative to the silicon seed sidewall 150. The ODTS forms a self-assmbled monolayer (SAM) on the surfaces of the deposition inhibiting layers 120, 170, and the deposition inhibiting sidewalls 170a, 170b.

Next, the row 200 is formed by selective atomic layer deposition on the seed sidewall 150. For example, the row 200 can be formed of $HfO_2$ deposited using tetrakis(dimethylamido)hafnium(IV) $(Hf[N(CH_3)_2]_4$ and water. Suitable methods for forming deposition inhibiting surfaces and depositing $HfO_2$ are discussed in Chen, Applied Physics Letters 86, 191910 (2005).

The row 210 is subsequently selectively deposited by atomic layer deposition on the deposited row 200. For example, ruthenium (Ru) is deposited on the sidewall of the $HfO_2$ row 200 to form the row 210. Suitable methods for selectively depositing Ru are discussed in Park, Applied Physics Letters 86, 051903 (2005).

The deposition of the $HfO_2$ and the Ru are alternately repeated to form a desired number of rows 200, 210. Subsequently, the rows 200, 210 are exposed, as discussed herein, and one of the rows is removed by exposure to etchant, e.g., in a wet etch selective for the material of one of the rows 200, 210 relative to other exposed materials.

In some embodiments, the inside surfaces of the cavity 180a are exposed to ODTS one or more times during the deposition of the rows 200, 210 to build up the ODTS layer on those inside surfaces.

Advantageously, atomic layer deposition allows the rows 200, 210 to be formed with high precision regarding the widths 202, 212, since the widths can be controlled by the number of deposition cycles performed, as known in the art. As a result, exceptionally uniform rows 200, 210 can be formed. In some other applications, the layer by layer deposition mechanism of ALD allows the formation, as desired, of rows 200, 210 having different widths.

In addition to forming integrated circuits, it will be appreciated that the selectively deposited rows disclosed herein can be used in various other applications where the formation of patterns with very small features is desired. For example, the preferred embodiments can be applied to form gratings, disk drives, storage media or templates or masks for other lithography techniques, including X-ray or imprint lithography. In other applications, multiple levels of the rows can be utilized in various light bending applications, in which spatially isolated blocks of material are formed "floating" and separated from other blocks of materials.

Floating blocks of material can be formed by depositing material into vias formed by crisscrossing rows of masking material (FIG. 13B) and the vias can be overlaid with material and additional vias can be formed and filled at a higher level. In other cases, the blocks of material can be the first or second masking materials themselves, with the molds dimensioned to form short blocks, rather than long rows of masking material. The deposition inhibiting material can be used to separate neighboring pluralities of the blocks.

It will be appreciated that only a section of the partially-formed structure 100 is shown. In some embodiments, a plurality of the molds 172 can be formed across the surface of the substrate 110 in a desired pattern. For example, the molds 172 can be formed in a regular array over the substrate 110 to pattern a regular array of features. For example, these features can be advantageously applied to form features in integrated circuit utilizing arrays of features, e.g., to form logic circuitry or memory devices, including flash memory or DRAM.

Also, while "processing" through a mask preferably involves etching underlying material(s), processing through the mask can involve subjecting material(s) underlying the mask materials to any semiconductor fabrication process. For example, processing can involve ion implantation, diffusion doping, depositing, oxidizing (particularly with use of a hard mask under the polymer mask), nitridizing, etc. through the mask layers and onto underlying layers. In addition, the mask can be used as a stop or barrier for chemical mechanical polishing (CMP) or CMP can be performed on various material(s) to allow for both planarization and etching.

It will be appreciated from the description herein that the invention includes various aspects. For example, according to one aspect of the invention, a patterning method is provided. The method comprises providing a substrate having a top surface that comprises a deposition inhibiting material. A mass of a sacrificial material is provided over the deposition inhibiting material. A seed wall is formed on one side of the mass of the sacrificial material. First and second deposition inhibiting walls are formed on opposite sides of the mass of the sacrificial material. The seed wall is disposed between and contacting the first and second deposition inhibiting walls. A deposition inhibiting cap layer is formed over the mass of the sacrificial material. The mass of the sacrificial material is selectively removed to form an open volume at least partially bounded by the seed wall, the first and second deposition inhibiting walls, the deposition inhibiting material and the cap layer. First and second materials are alternatingly deposited in the open volume.

According to another aspect of the invention, a method for forming a pattern is provided. The method comprises providing a substrate. A hollow mold is provided overlying the substrate. The mold has an opening into an open internal volume and a seed sidewall partially delimiting the open volume. A first material is selectively deposited on the seed sidewall in the open volume. A second material is selectively deposited on a side of the first material in the open volume.

According to yet another aspect of the invention, a method for depositing materials in a desired pattern is provided. The method comprises providing a substrate. The substrate is alternatingly exposed to first and second material precursors to deposit first and second materials on a first level. Depositing the first and second materials sequentially laterally grows a first plurality of alternating rows of the first and the second materials. One of the first and second materials is selectively removed relative to the other of the first and second materials.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

I claim:
1. A patterning method, comprising:
providing a substrate, a top surface of the substrate comprising a deposition inhibiting material;
providing a mass of a sacrificial material over the deposition inhibiting material;
forming a seed wall on one side of the mass of the sacrificial material;
forming first and second deposition inhibiting walls on opposite sides of the mass of the sacrificial material, the seed wall disposed between and contacting the first and second deposition inhibiting walls;
forming a deposition inhibiting cap layer over the mass of the sacrificial material;
selectively removing the mass of the sacrificial material to form an open volume at least partially bounded by the seed wall, the first and second deposition inhibiting walls, the deposition inhibiting material and the cap layer; and
alternatingly depositing a first material and a second material in the open volume.

2. The method of claim 1, wherein forming the seed wall comprises:
etching a first trench in the sacrificial material, the first trench exposing the deposition inhibiting material; and
depositing a seed material in the trench.

3. The method of claim 1, wherein forming the first and second deposition inhibiting walls comprises:
etching a second and a third trench in the sacrificial material, the second and third trenches exposing the deposition inhibiting material; and
depositing a deposition inhibiting material in the second and third trenches.

4. The method of claim 1, wherein forming the deposition inhibiting cap layer comprises continuing depositing deposition inhibiting material in the second and third trenches until the deposition inhibiting material extends over a top surface of the mass of sacrificial material.

5. The method of claim 1, wherein the deposition inhibiting material is an insulator.

6. The method of claim 5, wherein the seed wall is formed of a conductor.

7. The method of claim 1, wherein the first and the second deposition inhibiting walls are formed of the deposition inhibiting material disposed on the top surface of the substrate.

8. The method of claim 1, wherein the cap layer is formed of the deposition inhibiting material disposed on the top surface of the substrate.

9. The method of claim 1, wherein the sacrificial material is selected from the group consisting of molybdenum, silicon and tungsten.

10. A method for forming a pattern, comprising:
providing a substrate;
providing a hollow mold overlying the substrate, the mold having an opening into an open internal volume and a seed sidewall partially delimiting the open volume;
selectively depositing a first material on the seed sidewall in the open volume;
selectively depositing a second material on a side of the first material in the open volume;
selectively removing the mold;
selectively removing the first material; and
transferring a pattern defined by the second material to the substrate.

11. The method of claim 10, further comprising selectively depositing the first material on a side of the second material.

12. The method of claim 11, wherein selectively depositing the first material on the side of the second material and selectively depositing the second material on the side of the first material is repeated sequentially to form a plurality of alternating structures formed of the first and the second materials.

13. The method of claim 10, wherein selectively depositing the first material and selectively depositing the second material comprise performing atomic layer deposition.

14. A method for forming a pattern, comprising:
providing a substrate;
providing a hollow mold overlying the substrate, the mold having an opening into an open internal volume and a seed sidewall partially delimiting the open volume;
selectively depositing a first material on the seed sidewall in the open volume;
selectively depositing a second material on a side of the first material in the open volume;
selectively removing the mold;
selectively removing one of the first and second materials to form a plurality of spaced apart rows formed of the other of the first and second materials;
depositing a layer of spacer material on the spaced apart rows; and
anisotropically etching the layer of spacer material to form spacers on sidewalls of the spaced apart rows.

15. The method of claim 14, further comprising:
selectively removing the other of the first and second materials to leave a pattern of free-standing spacers; and
transferring a pattern defined by the free-standing spacers to the substrate.

16. A method for forming a pattern, comprising:
providing a substrate;
providing a hollow mold overlying the substrate, the mold having an opening into an open internal volume and a seed sidewall partially delimiting the open volume;
selectively depositing a first material on the seed sidewall in the open volume;
selectively depositing a second material on a side of the first material in the open volume,
wherein the open volume is delimited by deposition-inhibiting top and bottom internal mold surfaces, deposition-inhibiting mold sidewalls, and the seed sidewall, further comprising modifying inside surfaces of the mold to form the deposition-inhibiting mold sidewalls and the deposition-inhibiting top and bottom internal mold surfaces before selectively depositing the first material.

* * * * *